(12) United States Patent
Shin et al.

(10) Patent No.: US 8,723,309 B2
(45) Date of Patent: May 13, 2014

(54) INTEGRATED CIRCUIT PACKAGING SYSTEM WITH THROUGH SILICON VIA AND METHOD OF MANUFACTURE THEREOF

(75) Inventors: HanGil Shin, Seongnam-si (KR); YeongIm Park, Yongin (KR); HeeJo Chi, Yeoju-gun (KR)

(73) Assignee: STATS ChipPAC Ltd., Singapore (SG)

( * ) Notice: Subject to any disclaimer, the term of this patent is extended or adjusted under 35 U.S.C. 154(b) by 10 days.

(21) Appl. No.: 13/517,897

(22) Filed: Jun. 14, 2012

(65) Prior Publication Data
US 2013/0334697 A1 Dec. 19, 2013

(51) Int. Cl.
*H01L 23/04* (2006.01)

(52) U.S. Cl.
USPC ........... 257/698; 257/621; 257/774; 257/777; 257/686; 257/E23.174; 257/E21.597; 438/109; 438/667

(58) Field of Classification Search
CPC ............................................ H01L 2225/06541
USPC .......... 257/698, 621, 774, 777, 686, E23.174, 257/E21.597; 438/109, 667
See application file for complete search history.

(56) References Cited

U.S. PATENT DOCUMENTS

| | | | |
|---|---|---|---|
| 7,553,752 B2 | 6/2009 | Kuan et al. | |
| 7,723,159 B2 | 5/2010 | Do et al. | |
| 8,008,121 B2 | 8/2011 | Choi et al. | |
| 2011/0024887 A1 | 2/2011 | Chi et al. | |
| 2011/0215458 A1 | 9/2011 | Camacho et al. | |
| 2012/0018885 A1* | 1/2012 | Lee et al. | 257/738 |

* cited by examiner

*Primary Examiner* — Tu-Tu Ho
(74) *Attorney, Agent, or Firm* — Ishimaru & Associates LLP

(57) ABSTRACT

A method of manufacture of an integrated circuit packaging system includes: providing a bottom integrated circuit having bottom through silicon vias with a bottom via pitch; mounting outer interconnects over the bottom integrated circuit; and mounting a top integrated circuit between the outer interconnects, the top integrated circuit having top through silicon vias with a top via pitch less than the bottom via pitch.

18 Claims, 5 Drawing Sheets

INTEGRATED CIRCUIT PACKAGING SYSTEM WITH THROUGH SILICON VIA AND METHOD OF MANUFACTURE THEREOF

TECHNICAL FIELD

The present invention relates generally to an integrated circuit packaging system, and more particularly to a package system with through silicon via.

BACKGROUND ART

Modern electronics, such as smart phones, cell phones, digital cameras, personal digital assistants, location based services devices, and enterprise class appliances, are packing more integrated circuits into an ever shrinking physical space with expectations for decreasing cost. As more functions are packed into the integrated circuits and more integrated circuits into the package, integrated circuit packages must continue to provide a mechanism for making electrical interconnection between the integrated circuit die and the leads that are utilized to make electrical interconnections to circuits, power, and ground external to the integrated circuit die. In the early stages of integrated circuit development, there were relatively few connections between the integrated circuit die and the external circuitry.

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance. Different challenges arise from increased functionality integration and miniaturization.

Thus, a need still remains for an integrated circuit packaging system including high input/output density, low cost, and improved reliability. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a bottom integrated circuit having bottom through silicon vias with a bottom via pitch; mounting outer interconnects over the bottom integrated circuit; and mounting a top integrated circuit between the outer interconnects, the top integrated circuit having top through silicon vias with a top via pitch less than the bottom via pitch.

The present invention provides an integrated circuit packaging system, including: a bottom integrated circuit having bottom through silicon vias with a bottom via pitch; outer interconnects over the bottom integrated circuit; and a top integrated circuit between the outer interconnects, the top integrated circuit having top through silicon vias with a top via pitch less than the bottom via pitch.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
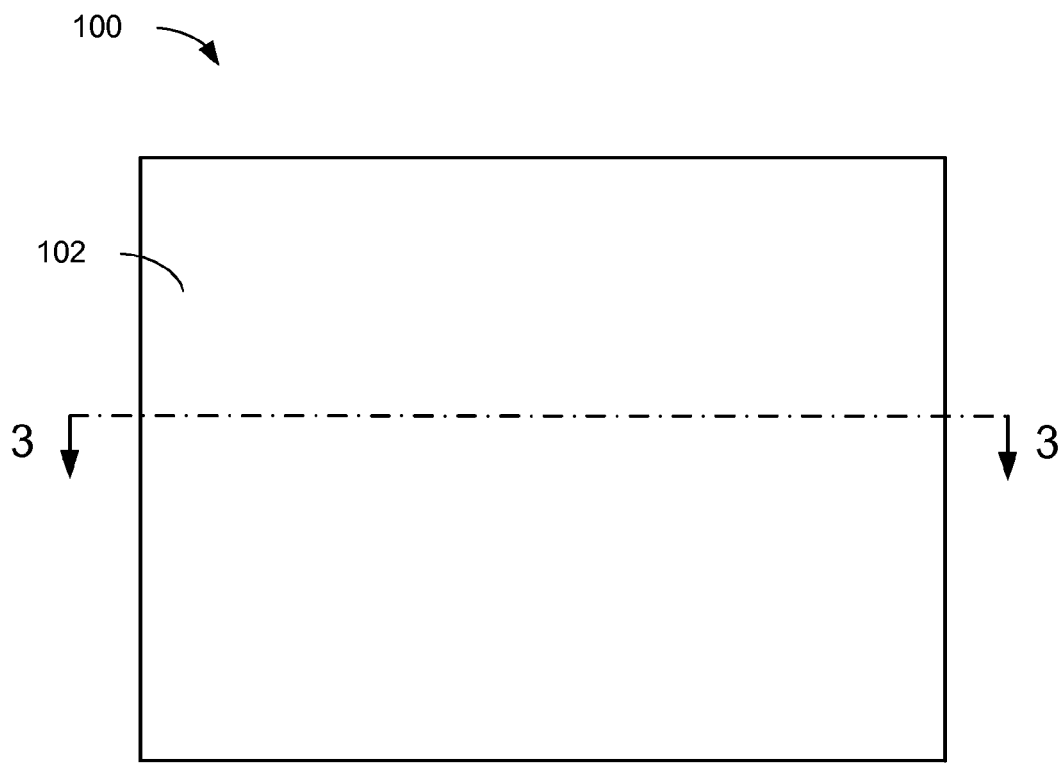
FIG. 1 is a top view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

In addition, where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active side of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact between elements.

The term "processing" as used herein includes deposition of material or photoresist, patterning, exposure, development, etching, cleaning, and/or removal of the material or photoresist as required in forming a described structure.

Referring now to FIG. 1, therein is shown a top view of an integrated circuit packaging system 100 in a first embodiment of the present invention. The integrated circuit packaging system 100 can include a top package 102, which is defined as a packaged integrated circuit. For example, the top package 102 can be mounted on other package or structures. For different example, other package or structures can be mounted on the top package 102.

Figure 2:
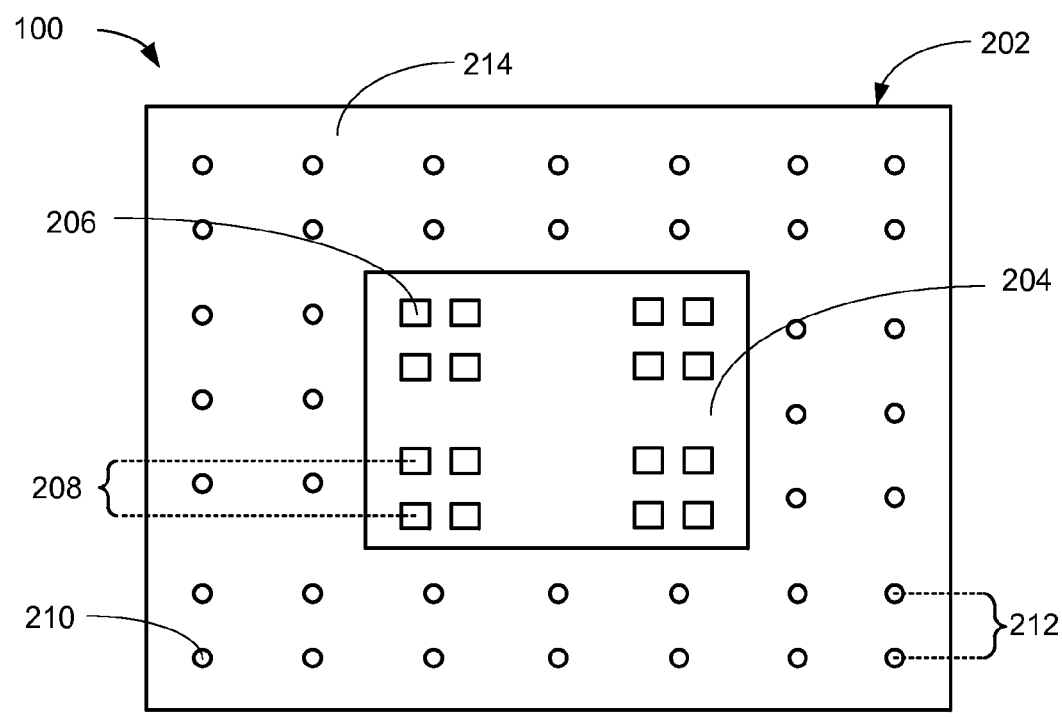
FIG. 2 is a top view of a bottom package of the integrated circuit packaging system.

Referring now to FIG. 2, therein is shown a top view of a bottom package 202 of the integrated circuit packaging system 100. The bottom package 202 is defined as a packaged integrated circuit. The bottom package 202 can include a top integrated circuit 204, which is defined as chip with active circuitry fabricated therein. For example, the top integrated circuit 204 can include a flip chip, a through silicon via die, a wire bonded chip, or a packaged integrated circuit.

The top integrated circuit 204 can include top through silicon vias 206. The top through silicon vias 206 can have a top via pitch 208, which is defined as a distance from a geometric center of one of the top through silicon vias 206 to the geometric center of another of the top through silicon vias 206 measured along a top surface of the top integrated circuit 204. For example, the top via pitch 208 can represent a minimum or maximum distance between geometric centers of one of the top through silicon vias 206 and another of the top through silicon vias 206. The top via pitch 208 can be greater than or equal to 20 micrometers (um). The top via pitch 208 can be same distance between all instances of the top through silicon vias 206.

The bottom package 202 can include outer interconnects 210, which are defined as electrical connectors. For example, the outer interconnects 210 can include conductive structures, such as conductive columns or solder balls. The outer interconnects 210 can include an outer interconnect pitch 212, which is defined as a distance from a geometric center of one of the outer interconnects 210 to the geometric center of another of the outer interconnects 210 measured along a top surface of a package encapsulation 214. For example, the outer interconnect pitch 212 can represent a minimum or maximum distance between geometric centers of one of the outer interconnects 210 and another of the outer interconnects 210. The outer interconnect pitch 212 can be greater than or equal to 200 um. The outer interconnect pitch 212 can be same distance between all instances of the outer interconnects 210.

The bottom package 202 can include the package encapsulation 214. The package encapsulation 214 is defined as a cover surrounding and protecting the contents in the integrated circuit packaging system 100 from the environment. For example, the package encapsulation 214 can conformably seal the contents in the contents in the integrated circuit packaging system 100. For another example, the package encapsulation 214 can hermetically seal the contents internal to the integrated circuit packaging system 100.

Figure 3:
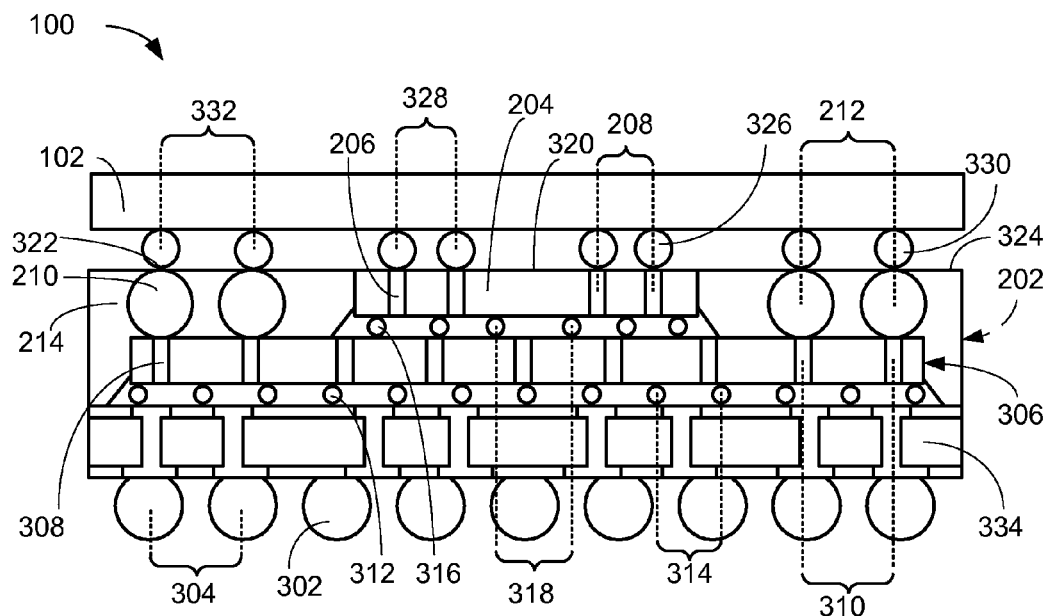
FIG. 3 is a cross-sectional view of the integrated circuit packaging system along the line 3-3 of FIG. 1.

Referring now to FIG. 3, therein is shown a cross-sectional view of the integrated circuit packaging system 100 along the line 3-3 of FIG. 1. The bottom package 202 of the integrated circuit packaging system 100 can include a package carrier 334, which is defined as a mounting structure for an integrated circuit or other electrical components as well as providing electrical connections between, to, and from the devices mounted thereto.

The bottom package 202 can include bottom external connectors 302, which are defined as electrical connectors. For example, the bottom external connectors 302 can include conductive structures, such as conductive columns or solder balls. The bottom external connectors 302 can connect to the package carrier 334 on a bottom side of the package carrier 334.

The bottom external connectors 302 can include a bottom external pitch 304, which is defined as a distance from a geometric center of one of the bottom external connectors 302 to another of the bottom external connectors 302 measured along a bottom surface of the package carrier 334. For example, the bottom external pitch 304 can represent a minimum or maximum distance between geometric centers of one of the bottom external connectors 302 and another of the bottom external connectors 302. The bottom external pitch 304 can be greater than or equal to 200 um. The bottom external pitch 304 can be same distance between all instances of the bottom external pitch 304.

The bottom package 202 can include a bottom integrated circuit 306 mounted over the package carrier 334. The bottom integrated circuit 306 is defined as chip with active circuitry fabricated therein. For example, the bottom integrated circuit 306 can include a flip chip, a through silicon via die, a wire bonded chip, or a packaged integrated circuit.

The bottom integrated circuit 306 can include bottom through silicon vias 308. The bottom through silicon vias 308 can have a bottom via pitch 310, which is defined as a distance from a geometric center of one of the bottom through silicon vias 308 to the geometric center of another of the bottom through silicon vias 308 measured along a top surface of the package carrier 334. For example, the bottom via pitch 310 can represent a minimum or maximum distance between geometric centers of one of the bottom through silicon vias 308 and another of the bottom through silicon vias 308. The bottom via pitch 310 can be greater than or equal to 20 um. To bottom via pitch 310 can be same distance between all instances of the bottom through silicon vias 308.

The bottom integrated circuit 306 can include bottom interconnects 312, which are defined as electrical connectors. For example, the bottom interconnects 312 can include conductive structures, such as conductive columns or solder balls.

The bottom interconnects 312 can include a bottom interconnect pitch 314, which is defined as a distance from a geometric center of one of the bottom interconnects 312 to the geometric center of another of the bottom interconnects 312 measured along the top surface of the package carrier 334. For example, the bottom interconnect pitch 314 can represent a minimum or maximum distance between geometric centers of one of the bottom interconnects 312 and another of the bottom interconnects 312. The bottom interconnect pitch 314 can be same distance between all instances of the bottom interconnects 312.

The package carrier 334 can have the bottom interconnects 312 attached on the top surface of the package carrier 334. The bottom integrated circuit 306 can be attached to the package carrier 334 through the bottom interconnects 312. The bottom interconnects 312 can provide electrical connections to active circuitry on the bottom integrated circuit 306, the bottom through silicon vias 308, electrical routing portions of the package carrier 334, such as pads or traces, or a combination thereof.

The bottom package 202 can include the outer interconnects 210 mounted on the bottom integrated circuit 306. The outer interconnects 210 can be on the bottom through silicon vias 308. The outer interconnects 210 can provide electrical connections to active circuitry on the bottom integrated circuit 306, the bottom through silicon vias 308, or a combination thereof.

The bottom package 202 can include the top integrated circuit 204 mounted between the outer interconnects 210 and over the bottom integrated circuit 306. The top integrated circuit 204 can include top interconnects 316, which are defined as electrical connectors. For example, the top interconnects 316 can include conductive structures, such as conductive columns or solder balls.

The top interconnects 316 can connect the top integrated circuit 204 to the bottom integrated circuit 306. The top interconnects 316 can provide electrical connections to active circuitry on the top integrated circuit 204, the top through silicon vias 206, active circuitry on the bottom integrated circuit 306, the bottom through silicon vias 308, or a combination thereof. The top interconnects 316 can electrically connect to the top through silicon vias 206 and the bottom through silicon vias 308 with a redistribution layer (RDL) (not shown).

The top interconnects 316 can have a top interconnect pitch 318, which is defined as a distance from a geometric center of one of the top interconnects 316 to the geometric center of another of the top interconnects 316 measured along a top surface of the bottom integrated circuit 306. For example, the top interconnect pitch 318 can represent a minimum or maximum distance between geometric centers of one of the top interconnects 316 and another of the top interconnects 316. The top interconnect pitch 318 can be greater than or equal to 40 um. The top interconnect pitch 318 can be same distance between all instances of the top interconnects 316.

The bottom package 202 can include the package encapsulation 214 formed over the package carrier 334, the bottom integrated circuit 306, the outer interconnects 210, and the top integrated circuit 204. More specifically, the package encapsulation 214 can be formed with a chip top surface 320 of the top integrated circuit 204 and a top interconnect surface 322 of the outer interconnects 210 exposed. Further, a top mold surface 324 of the package encapsulation 214 can be coplanar with the chip top surface 320.

For example, the chip top surface 320 can represent a side of the top integrated circuit 204 facing away from the bottom integrated circuit 306. Further, the top interconnect surface 322 can represent a side of the outer interconnects 210 facing away from the bottom integrated circuit 306. Additionally, the top mold surface 324 can represent a side of the package encapsulation 214 facing away from the bottom integrated circuit 306.

The integrated circuit packaging system 100 can include the top package 102 mounted over the bottom package 202. The top package 102 can include top inner external connectors 326, which are defined as electrical connectors. For example, the top inner external connectors 326 can include conductive structures, such as conductive columns or solder balls.

The top inner external connectors 326 can have a top inner external pitch 328, which is defined as a distance from a geometric center of one of the top inner external connectors 326 to another of the top inner external connectors 326 measured along the chip top surface 320. For example, the top inner external pitch 328 can represent a minimum or maximum distance between geometric centers of one of the top inner external connectors 326 and another of the top inner external connectors 326. The top inner external pitch 328 can be greater than or equal to 200 um. The top inner external pitch 328 can be same distance between all instances of the top inner external connectors 326.

The top inner external connectors 326 can connect to the top package 102 and the top integrated circuit 204. The top inner external connectors 326 can provide electrical connection to active circuitry on the top package, active circuitry on the top integrated circuit 204, the top through silicon vias 206, or a combination thereof.

The top package 102 can include top outer external connectors 330, which are defined as electrical connectors for electrical connection to other components. For example, the top outer external connectors 330 can include conductive columns or solder balls.

The top outer external connectors 330 can have a top outer external pitch 332, which is defined as a distance from a geometric center of one of the top outer external connectors 330 to another of the top outer external connectors 330 measured along the top mold surface 324. For example, the top outer external pitch 332 can represent a minimum or maximum distance between geometric centers of one of the top outer external connectors 330 and another of the top outer external connectors 330. The top outer external pitch 332 can be greater than or equal to 200 um. The top outer external pitch 332 can be same distance between all instances of the top outer external connectors 330.

The top package 102 can be mounted with the top outer external connectors 330 non-horizontally aligned with the outer interconnects 210 and the bottom through silicon vias 308. For different example, the top package 102 can be mounted with the top inner external connectors 326 vertically aligned with the top through silicon vias 206 and the top interconnects 316.

It has been discovered that having the top outer external connectors 330 and the outer interconnects 210 can reduce the profile of the semiconductor device. Further, the top inner external connectors 326 and the top through silicon vias 206 can reduce the profile of the semiconductor device. As a result, the lower profile allows the ability to stack another device over the integrated circuit packaging system 100, thus, lowering the production cost.

It has also been discovered that a vertical alignment of the outer interconnect 210, the top outer external connectors 330, and the bottom through silicon vias 308 can improve signal reliability between the top package 102 and the bottom package 202. Further, a vertical alignment of the top inner external connectors 326, the top through silicon vias 206, and the top interconnects 316 can improve signal reliability between the top package 102 and the bottom package 202. As a result, the improvement of signal reliability can improve the board level reliability and performance of the semiconductor device.

The various pitches of interconnects and vias can vary relative to each other. For example, the top via pitch 208 can be less than the bottom via pitch 310. For another example, the top via pitch 208 can be less than the outer interconnect pitch 212. For different example, the top via pitch 208 can be equal in distance to the top inner external pitch 328. For another example, the outer interconnect pitch 212 can be equal in distance to the top outer external pitch 332.

It has been discovered that having the top via pitch 208 less than the bottom via pitch 310 can reduce the profile of the semiconductor device. The smaller of the top via pitch 208 allows the top integrated circuit 204 to connect to the top interconnects 316, which can be smaller in size than the bottom external connectors 302. By having the top interconnects 316 within the bottom package 202 can reduce the profile of the semiconductor device. As a result, the lower profile allows the ability to stack another device over the integrated circuit packaging system 100, thus, lowering the production cost.

It has also been discovered that the top via pitch 208 less than the outer interconnect pitch 212 can increase circuit patterning flexibility for electrically connecting the top package 102 to the bottom package 202. The increased patterning flexibility allows more options for connections between the top package 102 and the bottom package 202, thus, improving signal reliability between the top package 102 and the bottom package 202. As a result, the improvement of signal reliability can improve the board level reliability and performance of the semiconductor device.

Figure 4:
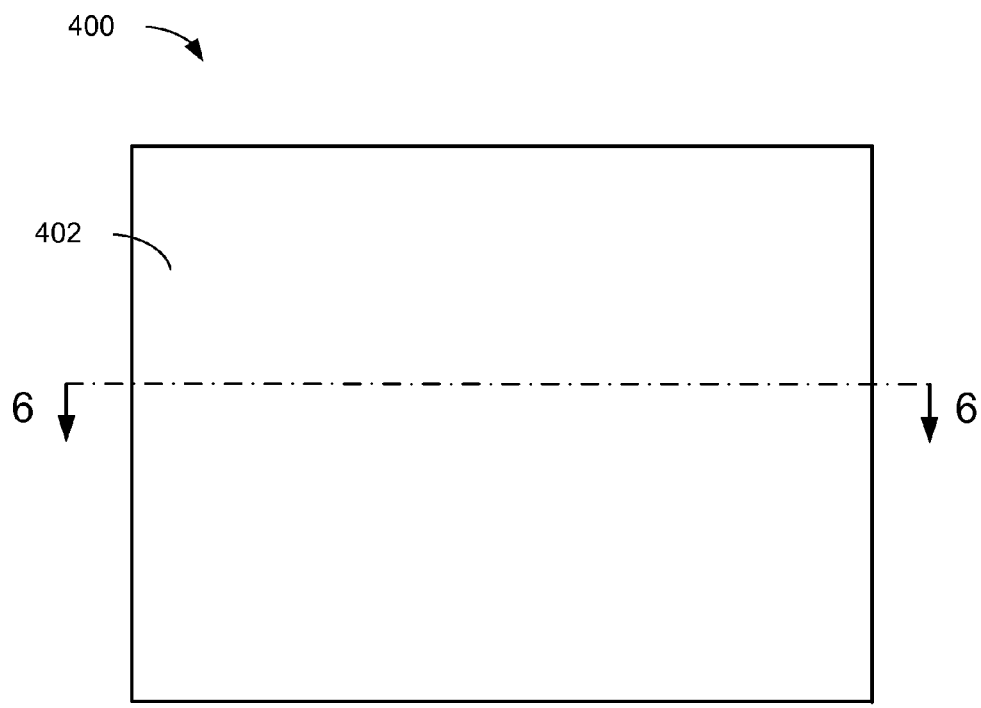
FIG. 4 is a top view of an integrated circuit packaging system in a second embodiment of the present invention.

Referring now to FIG. 4, therein is shown a top view of an integrated circuit packaging system 400 in a second embodiment of the present invention. The integrated circuit packaging system 400 can include a top package 402, which is defined as a packaged integrated circuit. For example, the top package 402 can be mounted on other package or structures. For different example, other package or structures can mount on the top package 402.

Figure 5:
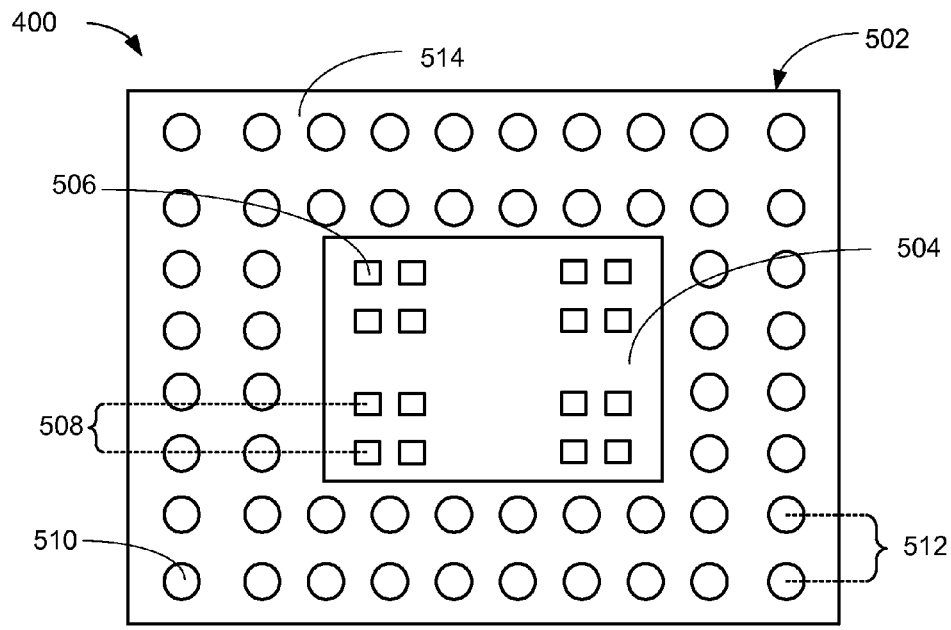
FIG. 5 is a top view of a bottom package of the integrated circuit packaging system.

Referring now to FIG. 5, therein is shown a top view of a bottom package 502 of the integrated circuit packaging system 400. The bottom package 502 is defined as a packaged integrated circuit. The bottom package 502 can include a top integrated circuit 504, which is defined as chip with active circuitry fabricated therein. For example, the top integrated circuit 504 can include a flip chip, a through silicon via die, a wire bonded chip, or a packaged integrated circuit.

The top integrated circuit 504 can include top through silicon vias 506. The top through silicon vias 506 can have a top via pitch 508, which is defined as a distance from a geometric center of one of the top through silicon vias 506 to the geometric center of another of the top through silicon vias 506 measured along a top surface of the top integrated circuit 504. For example, the top via pitch 508 can represent a minimum or maximum distance between geometric centers of one of the top through silicon vias 506 and another of the top through silicon vias 506. The top via pitch 508 can be greater than or equal to 20 um. The top via pitch 508 can be same distance between all instances of the top through silicon vias 506.

The bottom package 502 can include outer interconnects 510, which are defined as electrical connectors. For example, the outer interconnects 510 can include conductive structures, such as conductive columns or solder balls. The outer interconnects 510 can include an outer interconnect pitch 512, which is defined as a distance from a geometric center of one of the outer interconnects 510 to the geometric center of another of the outer interconnects 510 measured along a top surface of a package encapsulation 514. For example, the outer interconnect pitch 512 can represent a minimum or maximum distance between geometric centers of one of the outer interconnects 510 and another of the outer interconnects 510. The outer interconnect pitch 512 can be greater than or equal to 200 um. The outer interconnect pitch 512 can be same distance between all instances of the outer interconnects 510.

The bottom package 502 can include the package encapsulation 514. The package encapsulation 514 is defined as a cover surrounding and protecting the contents in the integrated circuit packaging system 400 from the environment. For example, the package encapsulation 514 can conformably seal the contents in the integrated circuit packaging system 400. For another example, the package encapsulation 514 can hermetically seal the contents internal to the integrated circuit packaging system 400.

Figure 6:
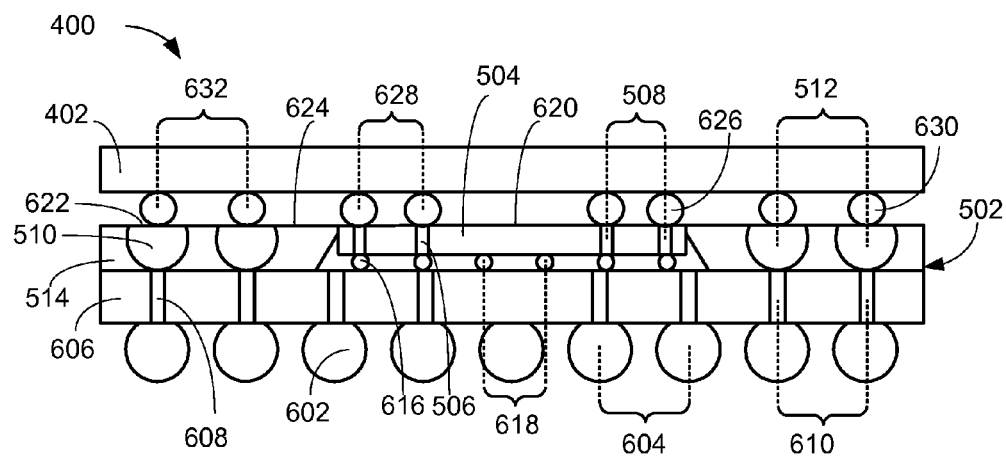
FIG. 6 is a cross-sectional view of the integrated circuit packaging system along the line 6-6 of FIG. 4.

Referring now to FIG. 6, therein is shown a cross-sectional view of the integrated circuit packaging system 400 along the line 6-6 of FIG. 4. The bottom package 502 can include a bottom integrated circuit 606, which is defined as chip with active circuitry fabricated therein. For example, the bottom integrated circuit 606 can include a flip chip, a through silicon via die, a wire bonded chip, or a packaged integrated circuit.

The bottom integrated circuit 606 can include bottom through silicon vias 608. The bottom through silicon vias 608 can have a bottom via pitch 610, which is defined as a distance from a geometric center of one of the bottom through silicon vias 608 to the geometric center of another of the bottom through silicon vias 608 measured along a bottom surface of the bottom integrated circuit 606. For example, the bottom via pitch 610 can represent a minimum or maximum distance between geometric centers of one of the bottom through silicon vias 608 and another of the bottom through silicon vias 608. The bottom via pitch 610 can be greater than or equal to 20 um. To bottom via pitch 610 can be same distance between all instances of the bottom through silicon vias 608.

The bottom package 502 can include bottom external connectors 602, which are defined as electrical connectors. For example, the bottom external connectors 602 can include conductive structures, such as conductive columns or solder balls. The bottom external connectors 602 can connect to the bottom integrated circuit 606 on the bottom surface of the bottom integrated circuit 606.

The bottom external connectors 602 can have a bottom external pitch 604, which is defined as a distance from a geometric center of one of the bottom external connectors 602 to another of the bottom external connectors 602 measured along the bottom surface of the bottom integrated circuit 606. For example, the bottom external pitch 604 can represent a minimum or maximum distance between geometric centers of one of the bottom external connectors 602 and another of the bottom external connectors 602. The bottom external pitch 604 can be greater than or equal to 200 um. The bottom external pitch 604 can be same distance between all instances of the bottom external pitch 604.

The bottom package 502 can include the outer interconnects 510 mounted over the bottom integrated circuit 606. The bottom package 502 can include the top integrated circuit 504 mounted between the outer interconnects 510 and over the bottom integrated circuit 606. The top integrated circuit 504 can include top interconnects 616, which are defined as electrical connectors. For example, the top interconnects 616 can include conductive structures, such as conductive columns or solder balls.

The top interconnects 616 can connect the top integrated circuit 504 to the bottom integrated circuit 606. The top interconnects 616 can provide electrical connections to active circuitry on the top integrated circuit 504, the top through silicon vias 506, active circuitry on the bottom integrated circuit 606, the bottom through silicon vias 608, or a combination thereof. The top interconnects 616 can electrically connect to the top through silicon vias 506 and the bottom through silicon vias 608 with the RDL (not shown).

The top interconnects 616 can have a top interconnect pitch 618, which is defined as a distance from a geometric center of one of the top interconnects 616 to the geometric center of another of the top interconnects 616 measured along a top surface of the bottom integrated circuit 606. For example, the top interconnect pitch 618 can represent a minimum or maximum distance between geometric centers of one of the top interconnects 616 and another of the top interconnects 616. The top interconnect pitch 618 can be greater than or equal to 40 um. The top interconnect pitch 618 can be same distance between all instances of the top interconnects 616.

The bottom package 502 can include the package encapsulation 514 formed over the bottom integrated circuit 606, the outer interconnects 510, and the top integrated circuit 504. More specifically, the package encapsulation 514 can be formed with a chip top surface 620 of the top integrated circuit 504 and a top interconnect surface 622 of the outer interconnects 510 exposed. Further, a top mold surface 624 of the package encapsulation 514 can be coplanar with the chip top surface 620 and the top interconnect surface 622.

For example, the chip top surface 620 can represent a side of the top integrated circuit 504 facing away from the bottom integrated circuit 606. Further, the top interconnect surface 622 can represent a side of the outer interconnects 510 facing away from the bottom integrated circuit 606. Additionally, the top mold surface 624 can represent a side of the package encapsulation 514 facing away from the bottom integrated circuit 606.

The integrated circuit packaging system 400 can include the top package 402 mounted over the bottom package 502. The top package 402 can include top inner external connectors 626, which are defined as electrical connector. For example, the top inner external connectors 626 can include conductive structures, such as conductive columns or solder balls.

The top inner external connectors 626 can have a top inner external pitch 628, which is defined as a distance from a geometric center of one of the top inner external connectors 626 to another of the top inner external connectors 626 measured along the chip top surface 620. For example, the top inner external pitch 628 can represent a minimum or maximum distance between geometric centers of one of the top inner external connectors 626 and another of the top inner external connectors 626. The top inner external pitch 628 can be greater than or equal to 200 um. The top inner external pitch 628 can be same distance between all instances of the top inner external connectors 626.

The top inner external connectors 626 can connect to the top package 402 and the top integrated circuit 504. The top inner external connectors 626 can provide electrical connection to active circuitry on the top package, active circuitry on the top integrated circuit 504, the top through silicon vias 506, or a combination thereof.

The top package 402 can include top outer external connectors 630, which are defined as electrical connectors. For example, the top outer external connectors 630 can include conductive structures, such as conductive columns or solder balls.

The top outer external connectors 630 can have a top outer external pitch 632, which is defined as a distance from a geometric center of one of the top outer external connectors 630 to another of the top outer external connectors 630 measured along a bottom surface of the top package 402. For example, the top outer external pitch 632 can represent a minimum or maximum distance between geometric centers of one of the top outer external connectors 630 and another of the top outer external connectors 630. The top outer external pitch 632 can be greater than or equal to 200 um. The top outer external pitch 632 can be same distance between all instances of the top outer external connectors 630.

The top package 402 can be mounted with the top outer external connectors 630 non-horizontally aligned with the outer interconnects 510, the bottom through silicon vias 608, and the bottom external connectors 602. For different example, the top package 402 can be mounted with the top inner external connectors 626 vertically aligned with the top through silicon vias 506 and the top interconnects 616.

It has been discovered that having the top outer external connectors 630 and the outer interconnects 510 can reduce the profile of the semiconductor device. Further, the top inner external connectors 626 and the top through silicon vias 506 can reduce the profile of the semiconductor device. As a result, the lower profile allows the ability to stack another device over the integrated circuit packaging system 400, thus, lowering the production cost.

It has also been discovered that a vertical alignment of the outer interconnects 402, the top outer external connectors 630, and the bottom through silicon vias 608 can improves signal reliability between the top package 402 and the bottom package 502. Further, a vertical alignment of the top inner external connectors 626, the top through silicon vias 506, and the top interconnects 616 can improves signal reliability between the top package 402 and the bottom package 502. As a result, the improvement of signal reliability can improve the board level reliability and performance of the semiconductor device.

The various pitches of interconnects and vias can vary relative to each other. For example, the top via pitch 508 can be less than the bottom via pitch 610. For another example, the top via pitch 508 can be less than the outer interconnect pitch 512. For different example, the top via pitch 508 can be equal in distance to the top inner external pitch 628. For another example, the outer interconnect pitch 512 can be equal in distance to the top outer external pitch 632.

It has been discovered that having the top via pitch 508 less than the bottom via pitch 610 can reduce the profile of the semiconductor device. The smaller of the top via pitch 508 allows the top integrated circuit 504 to connect to the top interconnects 616, which can be smaller in size than the bottom external connectors 602. By having the top interconnects 616 within the bottom package 502 can reduce the profile of the semiconductor device. As a result, the lower profile allows the ability to stack another device over the integrated circuit packaging system 400, thus, lowering the production cost.

It has also been discovered that the top via pitch 508 less than the outer interconnect pitch 512 can increase circuit patterning flexibility for electrically connecting the top package 402 to the bottom package 502. The increased patterning flexibility allows more options for connections between the top package 402 and the bottom package 502, thus, improving signal reliability between the top package 402 and the bottom package 502. As a result, the improvement of signal reliability can improve the board level reliability and performance of the semiconductor device.

Figure 7:
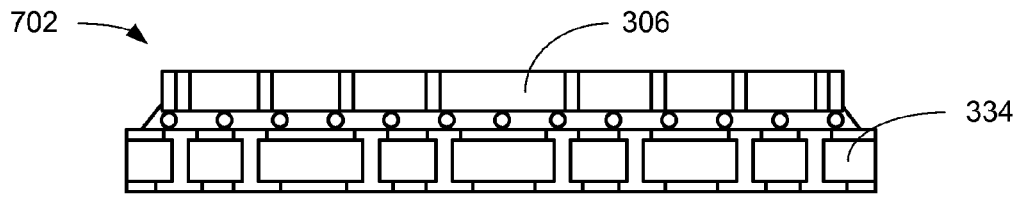
FIG. 7 is a cross-sectional view of a structure for manufacture of the integrated circuit packaging system of FIG. 1 after mounting phase of the manufacture.

Referring now to FIG. 7, therein is a cross-sectional view of a structure 702 for manufacture of the integrated circuit packaging system 100 of FIG. 1 after mounting phase of the manufacture. The structure 702 can include the bottom integrated circuit 306 mounted over the package carrier 334.

Figure 8:
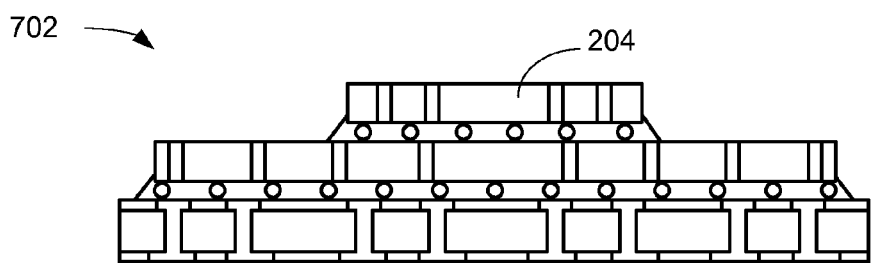
FIG. 8 is a cross-sectional view of the structure for manufacture of the integrated circuit packaging system of FIG. 1 after mounting phase of the manufacture.

Referring now to FIG. 8, therein is a cross-sectional view of the structure 702 for manufacture of the integrated circuit packaging system 100 of FIG. 1 after mounting phase of the manufacture. The top integrated circuit 204 can be mounted over the structure 702.

Figure 9:
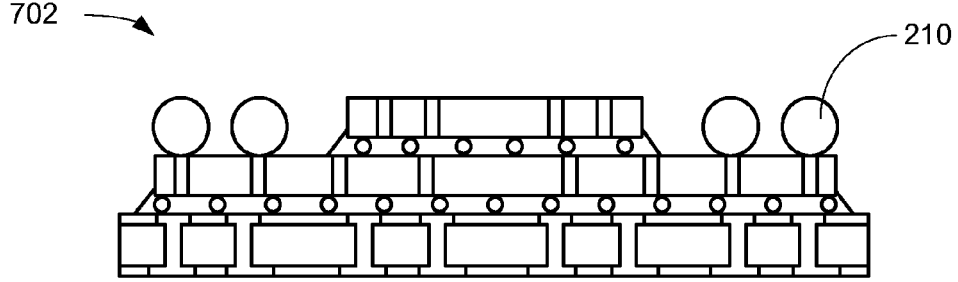
FIG. 9 is a cross-sectional view of the structure for manufacture of the integrated circuit packaging system of FIG. 1 after mounting phase of the manufacture.

Referring now to FIG. 9, therein is a cross-sectional view of the structure 702 for manufacture of the integrated circuit packaging system 100 of FIG. 1 after mounting phase of the manufacture. The outer interconnects 210 can be mounted over the structure 702.

Figure 10:
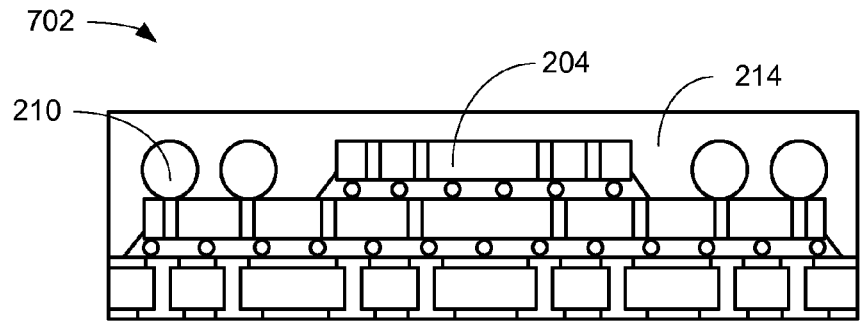
FIG. 10 is a cross-sectional view of the structure for manufacture of the integrated circuit packaging system of FIG. 1 after mold phase of the manufacture.

Referring now to FIG. 10, therein is a cross-sectional view of the structure 702 for manufacture of the integrated circuit packaging system 100 of FIG. 1 after mold phase of the manufacture. The package encapsulation 214 can be formed over the structure 702, the top integrated circuit 204, and the outer interconnects 210.

Figure 11:
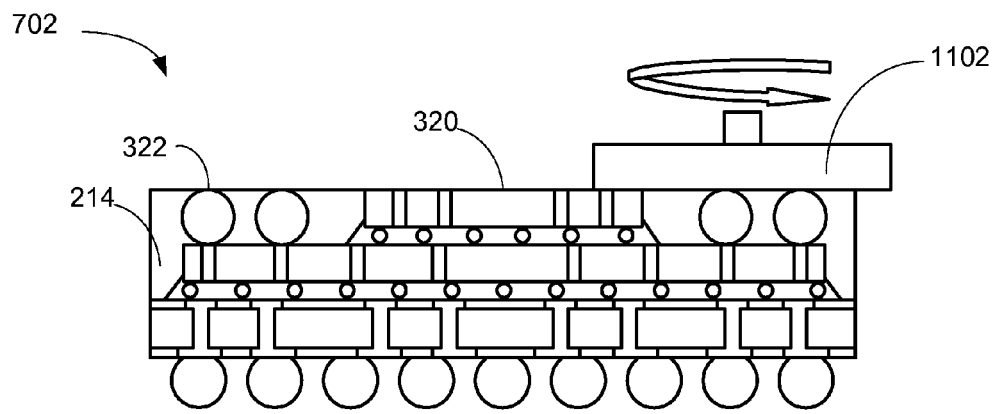
FIG. 11 is a cross-sectional view of the structure for manufacture of the integrated circuit packaging system of FIG. 1 after grinding phase of the manufacture.

Referring now to FIG. 11, therein is a cross-sectional view of the structure 702 for manufacture of the integrated circuit packaging system 100 of FIG. 1 after grinding phase of the manufacture. The package encapsulation 214 can be grinded by a grinding wheel 1102 to expose the chip top surface 320 and the top interconnect surface 322.

Figure 12:
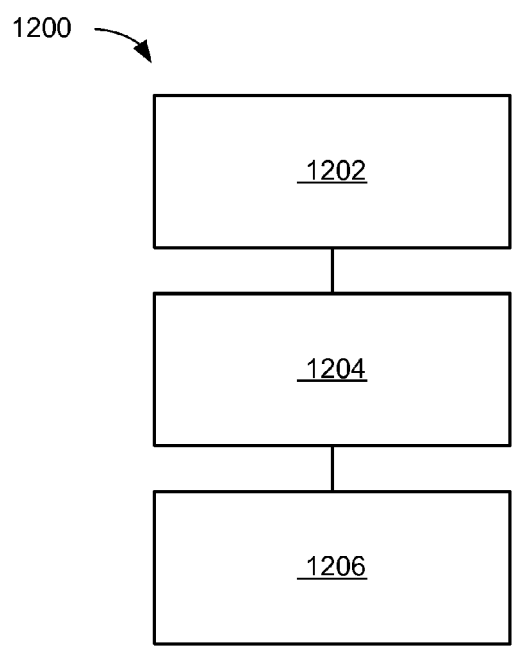
FIG. 12 is a flow chart of a method of manufacture of the integrated circuit packaging system of FIG. 1 in a further embodiment of the present invention.

Referring now to FIG. 12 is a flow chart of a method 1200 of manufacture of the integrated circuit packaging system 100 of FIG. 1 in a further embodiment of the present invention. The method 1200 includes providing a bottom integrated circuit having bottom through silicon vias with a bottom via pitch in a block 1202; mounting outer interconnects over the bottom integrated circuit in a block 1204; and mounting a top integrated circuit between the outer interconnects, the top integrated circuit having top through silicon vias with a top via pitch less than the bottom via pitch in a block 1206.

Thus, it has been discovered that the integrated circuit packaging system of the present invention furnishes important and heretofore unknown and unavailable solutions, capabilities, and functional aspects for an integrated circuit packaging system with encapsulation. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance. These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto for set forth herein or shown in the accompanying drawings are to be interpreted in an illustrative and non-limiting sense.

What is claimed is:

1. A method of manufacture of an integrated circuit packaging system comprising:
   providing a bottom integrated circuit having bottom through silicon vias with a bottom via pitch;
   mounting outer interconnects over the bottom integrated circuit;
   mounting a top integrated circuit between the outer interconnects, the top integrated circuit having top through silicon vias with a top via pitch less than the bottom via pitch; and
   forming a package encapsulation having a top mold surface coplanar with a chip top surface of the top integrated circuit.

2. The method as claimed in claim 1 wherein mounting the outer interconnects includes mounting the outer interconnects having an outer interconnect pitch greater than the top via pitch.

3. The method as claimed in claim 1 wherein forming the package encapsulation includes having the top mold surface coplanar with a top interconnect surface of the outer interconnect.

4. The method as claimed in claim 1 wherein mounting the top integrated circuit includes mounting the top integrated circuit with top interconnects having a top interconnect pitch equal to the top via pitch.

5. A method of manufacture of an integrated circuit packaging system comprising:
   providing a bottom integrated circuit having bottom through silicon vias with a bottom via pitch;
   mounting outer interconnects over the bottom integrated circuit;
   mounting a top integrated circuit between the outer interconnects, the top integrated circuit having top through silicon vias with a top via pitch less than the bottom via pitch; and
   forming a package encapsulation having a top mold surface coplanar with a chip top surface of the for integrated circuit, the package encapsulation over the bottom integrated circuit, the outer interconnects, and the top integrated circuit.

6. The method as claimed in claim 5 wherein:
   mounting the top integrated circuit includes mounting the top integrated circuit with top interconnects over the bottom integrated circuit, the top interconnects having a top interconnect pitch less than the bottom via pitch; and
further comprising:
   mounting a top package over the top integrated circuit.

7. The method as claimed in claim 5 further comprising:
   forming a bottom package having a bottom external connector and the package encapsulation; and
   mounting a top package having a top outer external connector over the bottom package, the top outer external connector non-horizontally aligned with the outer interconnect, the bottom through silicon via, and the bottom external connector.

8. The method as claimed in claim 5 further comprising:
   forming a bottom package having a bottom external connector and the top integrated circuit with a top interconnect; and
   mounting a top package having a top inner external connector over the bottom package, the top inner external connector non-horizontally aligned with the top through silicon via and the top interconnect.

9. The method as claimed in claim 5 further comprising:
   providing a package carrier; and
   forming a bottom package with the top integrated circuit and the bottom integrated circuit, the top integrated circuit and the bottom integrated circuit over the package carrier.

10. An integrated circuit packaging system comprising:
a bottom integrated circuit having bottom through silicon vias with a bottom via pitch;
outer interconnects over the bottom integrated circuit:
a top integrated circuit between the outer interconnects, the top integrated circuit having to through silicon vias with a top via pitch less than the bottom via pitch; and
a package encapsulation having a top mold surface coplanar with a chip top surface of the top integrated circuit.

11. The system as claimed in claim 10 wherein the outer interconnects includes the outer interconnects having an outer interconnect pitch greater than the top via pitch.

12. The system as claimed in claim 10 wherein the top mold surface of the package encapsulation is coplanar with a top interconnect surface of the outer interconnect.

13. The system as claimed in claim 10 wherein the top integrated circuit includes the top integrated circuit with top interconnects having a top interconnect pitch equal to the top via pitch.

14. The system as claimed in claim 10 wherein the package encapsulation is over the bottom integrated circuit, the outer interconnects, and the top integrated circuit.

15. The system as claimed in claim 14 wherein:
the top integrated circuit includes the top integrated circuit with top interconnects over the bottom integrated circuit, the top interconnects having a top interconnect pitch less than the bottom via pitch; and
further comprising:
a top package over the top integrated circuit.

16. The system as claimed in claim 14 further comprising:
a bottom package having a bottom external connector and the package encapsulation; and
a top package having a top outer external connector over the bottom package, the top outer external connector non-horizontally aligned with the outer interconnect, the bottom through silicon via, and the bottom external connector.

17. The system as claimed in claim 14 further comprising:
a bottom package having a bottom external connector and the top integrated circuit with a top interconnect; and
a top package having a top inner external connector over the bottom package, the top inner external connector non-horizontally aligned with the top through silicon via and the top interconnect.

18. The system as claimed in claim 14 further comprising:
a package carrier; and
a bottom package with the top integrated circuit and the bottom integrated circuit, the top integrated circuit and the bottom integrated circuit over the package carrier.

* * * * *

UNITED STATES PATENT AND TRADEMARK OFFICE
CERTIFICATE OF CORRECTION

| | | |
|---|---|---|
| PATENT NO. | : 8,723,309 B2 | Page 1 of 1 |
| APPLICATION NO. | : 13/517897 | |
| DATED | : May 13, 2014 | |
| INVENTOR(S) | : Shin et al. | |

It is certified that error appears in the above-identified patent and that said Letters Patent is hereby corrected as shown below:

In the Claims:

Column 12, Claim 5, line 35, delete "of the for" and insert therefor --of the top--

Signed and Sealed this
Sixteenth Day of February, 2016

Michelle K. Lee
*Director of the United States Patent and Trademark Office*